(12) United States Patent
Tian et al.

(10) Patent No.: US 12,550,575 B2
(45) Date of Patent: Feb. 10, 2026

(54) DISPLAY PANEL AND DISPLAY APPARATUS

(71) Applicant: BOE TECHNOLOGY GROUP CO., LTD., Beijing (CN)

(72) Inventors: Xueyan Tian, Beijing (CN); Xinshe Yin, Beijing (CN); Wei Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 540 days.

(21) Appl. No.: 17/926,706

(22) PCT Filed: Aug. 4, 2021

(86) PCT No.: PCT/CN2021/110632
§ 371 (c)(1),
(2) Date: Nov. 21, 2022

(87) PCT Pub. No.: WO2022/068383
PCT Pub. Date: Apr. 7, 2022

(65) Prior Publication Data
US 2023/0209949 A1   Jun. 29, 2023

(30) Foreign Application Priority Data
Sep. 30, 2020   (CN) .......................... 202011062894.9

(51) Int. Cl.
*H01L 23/60*   (2006.01)
*H10D 89/60*   (2025.01)
(Continued)

(52) U.S. Cl.
CPC ......... *H10K 59/353* (2023.02); *H10D 89/811* (2025.01); *H10K 59/1213* (2023.02); *H10K 59/122* (2023.02); *H10K 59/179* (2023.02)

(58) Field of Classification Search
CPC ............ H10K 59/353; H10K 59/1213; H10K 59/122; H10K 59/179; H10K 59/121;
(Continued)

(56) References Cited

U.S. PATENT DOCUMENTS 9,245,936 B2   1/2016 Choi et al.
2008/0135515 A1   6/2008 Pu et al.
(Continued)

FOREIGN PATENT DOCUMENTS

CN   101153969 A   4/2008
CN   101196658 A   6/2008
(Continued)

OTHER PUBLICATIONS

Extended European Search Report on the European Patent Application No. 21812847.8 issued by the European Patent Office on Aug. 28, 2023.
(Continued)

*Primary Examiner* — Samuel Park
(74) *Attorney, Agent, or Firm* — XSENSUS LLP

(57) ABSTRACT

A display panel has a display region and a bezel region located on side(s) of the display region. The display panel includes a substrate; a plurality of sub-pixels disposed on a side of the substrate and located in the display region; a mirror layer disposed on a side of the plurality of sub-pixels away from the substrate; and an electrostatic protection portion electrically connected to the mirror layer and located in the bezel region. The electrostatic protection portion is configured to provide electrostatic protection for the mirror layer.

17 Claims, 6 Drawing Sheets

(51) Int. Cl.
*H10K 59/121* (2023.01)
*H10K 59/122* (2023.01)
*H10K 59/179* (2023.01)
*H10K 59/35* (2023.01)

(58) Field of Classification Search
CPC .... H10K 59/126; H10K 59/878; H10K 59/12; H10D 89/811; H10D 89/911; H10D 89/931; H01L 23/60; H05F 3/00
See application file for complete search history.

(56) References Cited

U.S. PATENT DOCUMENTS

| | | | |
|---|---|---|---|
| 2011/0234509 | A1 | 9/2011 | Lee et al. |
| 2014/0332765 | A1 | 11/2014 | Kim |
| 2017/0069808 | A1 | 3/2017 | Kim et al. |
| 2017/0104182 | A1 | 4/2017 | Kim et al. |
| 2017/0116929 | A1 | 4/2017 | Hirakata |
| 2017/0154943 | A1 | 6/2017 | Yang et al. |
| 2017/0221982 | A1 | 8/2017 | Park |
| 2017/0250378 | A1 | 8/2017 | Gu et al. |
| 2018/0190740 | A1* | 7/2018 | Bang ..................... H10K 59/38 |
| 2019/0036073 | A1 | 1/2019 | Yu et al. |
| 2019/0196290 | A1 | 6/2019 | Shih et al. |
| 2020/0211477 | A1 | 7/2020 | Lai et al. |
| 2020/0301219 | A1* | 9/2020 | Kuroe ................. G09G 3/3611 |
| 2021/0013270 | A1* | 1/2021 | Yu ......................... H10K 59/12 |
| 2021/0226168 | A1 | 7/2021 | Lv |
| 2021/0376290 | A1 | 12/2021 | Zhang et al. |
| 2022/0114355 | A1 | 4/2022 | Xia et al. |
| 2022/0336567 | A1 | 10/2022 | Tian et al. |

FOREIGN PATENT DOCUMENTS

| | | | |
|---|---|---|---|
| CN | 103715681 | A | 4/2014 |
| CN | 104465713 | A | 3/2015 |
| CN | 104867450 | A | 8/2015 |
| CN | 105425457 | A * | 3/2016 |
| CN | 105609658 | A | 5/2016 |
| CN | 106444135 | A | 2/2017 |
| CN | 107026245 | A | 8/2017 |
| CN | 107123664 | A | 9/2017 |
| CN | 107342284 | A | 11/2017 |
| CN | 108319090 | A | 7/2018 |
| CN | 108538894 | A | 9/2018 |
| CN | 108766994 | A | 11/2018 |
| CN | 108878480 | A | 11/2018 |
| CN | 109148719 | A | 1/2019 |
| CN | 109698206 | A | 4/2019 |
| CN | 110164916 | A | 8/2019 |
| CN | 110335953 | A | 10/2019 |
| CN | 110767841 | A | 2/2020 |
| CN | 110828695 | A | 2/2020 |
| CN | 110838509 | A | 2/2020 |
| CN | 110838559 | A | 2/2020 |
| CN | 110931540 | A | 3/2020 |
| CN | 110993806 | A | 4/2020 |
| CN | 111200082 | A | 5/2020 |
| CN | 111584603 | A | 8/2020 |
| CN | 111785767 | A | 10/2020 |
| CN | 112186019 | A | 1/2021 |
| CN | 112216732 | A | 1/2021 |

OTHER PUBLICATIONS

International Search Report and Written Opinion for Chinese Patent Application No. PCT/CN2021/080865 issued by the International Searching Authority (Chinese Patent Office) on Jun. 23, 2021.
International Search Report and Written Opinion for Chinese Patent Application No. PCT/CN2021/093421 issued by the International Searching Authority (Chinese Patent Office) on Aug. 10, 2021.
First Office Action for Chinese Patent Application No. 202010466036.4 issued on the Chinese Patent Office by Jul. 8, 2022.
First Office Action for Chinese Patent Application No. 202011062894.9 issued by bhe Chinese Patent Office on Mar. 2, 2022.
First Office Action for Chinese Patent Application No. 202180000479.7 issued by the Chinese Patent Office on Jun. 13, 2022.
Second Office Action for Chinese Patent Application No. 202180000479.7 issued by the Chinese Patent Office on Oct. 17, 2022.

* cited by examiner

DISPLAY PANEL AND DISPLAY APPARATUS

CROSS-REFERENCE TO RELATED APPLICATIONS

This application is a national phase entry under 35 USC 371 of International Patent Application No. PCT/CN2021/110632, filed on Aug. 4, 2021, which claims priority to Chinese Patent Application No. 202011062894.9, filed on Sep. 30, 2020, which are incorporated herein by reference in their entirety.

TECHNICAL FIELD

The present disclosure relates to the field of display technologies, and in particular, to a display panel and a display apparatus.

BACKGROUND

With the development of science and technology, users have more and more demands for functional types of display apparatuses. At present, mirror display apparatuses appear. The mirror display apparatus can realize both a display function and a mirror function. That is, the user can use the mirror display apparatus as a mirror while seeing display images from the mirror display apparatus.

SUMMARY

In an aspect, a display panel is provided. The display panel has a display region and a bezel region located on at least one side of the display region. The display panel includes a substrate; a plurality of sub-pixels disposed on a side of the substrate and located in the display region; a mirror layer disposed on a side of the plurality of sub-pixels away from the substrate; and an electrostatic protection portion electrically connected to the mirror layer and located in the bezel region. The electrostatic protection portion is configured to provide electrostatic protection for the mirror layer.

In some embodiments, the bezel region includes a bonding region. The display panel has at least one first fixed voltage signal terminal disposed in the bonding region, wherein the electrostatic protection portion includes a first electrostatic protection sub-portion electrically connected to the mirror layer and the at least one first fixed voltage signal terminal. The first electrostatic protection sub-portion is configured to transmit static electricity generated on the mirror layer to the at least one first fixed voltage signal terminal.

In some embodiments, the display panel further includes: at least one low power supply voltage signal line disposed in the bezel region; at least one first conductive pin disposed in the bonding region and electrically connected to the at least one low power supply voltage signal line; and a flexible printed circuit bonded to the at least one first conductive pin. The flexible printed circuit has a low power supply voltage signal point; and the flexible printed circuit is configured to transmit, by the low power supply voltage signal point, a low power supply voltage signal to the at least one low power supply voltage signal line through the at least one first conductive pin. A first conductive pin in the at least one first conductive pin serves as a first fixed voltage signal terminal. The first electrostatic protection sub-portion includes at least one first lead, a first lead in the at least one first lead is electrically connected to the mirror layer and the first conductive pin serving as the first fixed voltage signal terminal. The first lead is configured to transmit the static electricity generated on the mirror layer to the low power supply voltage signal point of the flexible printed circuit through the first conductive pin.

In some embodiments, the display panel further includes chip on film bonded to the at least one first conductive pin. The flexible printed circuit is bonded to the at least one first conductive pin through the chip on film. The first lead is configured to transmit the static electricity generated on the mirror layer to the low power supply voltage signal point of the flexible printed circuit through the first conductive pin and the chip on film.

In some embodiments, the display panel further includes: at least one grounding line disposed in the bezel region; at least one second conductive pin disposed in the bonding region and electrically connected to the at least one grounding line; a chip on film bonded to the at least one second conductive pin; and a flexible printed circuit bonded to the chip on film, the flexible printed circuit having a grounding line point. A second conductive pin in the at least one second conductive pin serves as a first fixed voltage signal terminal. The first electrostatic protection sub-portion includes at least one second lead, a second lead is electrically connected to the mirror layer and the second conductive pin serving as the first fixed voltage signal terminal. The second lead is configured to transmit the static electricity generated on the mirror layer to the grounding line point of the flexible printed circuit through the second conductive pin and the chip on film.

In some embodiments, in a case where the first electrostatic protection sub-portion includes the at least one first lead, the at least one first lead and the mirror layer are made of a same material and disposed in a same layer. In a case where the first electrostatic protection sub-portion includes the at least one second lead, the at least one second lead and the mirror layer are made of a same material and disposed in a same layer.

In some embodiments, the display panel further includes an encapsulation layer disposed between the plurality of sub-pixels and the mirror layer, and covering the plurality of sub-pixels. In a case where the first electrostatic protection sub-portion includes the at least one first lead, the at least one first lead is in contact with a side face of the encapsulation layer and extend to the bonding region along the side face of the encapsulation layer. In a case where the first electrostatic protection sub-portion includes the at least one second lead, the at least one second lead is in contact with the side face of the encapsulation layer and extend to the bonding region along the side surface of the encapsulation layer.

In some embodiments, in a direction in which the bonding region and the display region are arranged, a bisector of the display region substantially coincides with a bisector of the bonding region. In a case where the first electrostatic protection sub-portion includes the at least one first lead, the at least one first lead includes a plurality of first leads, and the plurality of first leads are symmetrically distributed relative to the bisector of the display region. In a case where the first electrostatic protection sub-portion includes at least one second lead, the at least one second lead includes a plurality of second leads, and the plurality of second leads are symmetrically distributed relative to the bisector of the display region.

In some embodiments, the display panel has a plurality of second fixed voltage signal terminals that are disposed in the bezel region; the plurality of second fixed voltage signal terminals include a first voltage signal terminal and a second voltage signal terminal, and a voltage of a first voltage signal transmitted by the first voltage signal terminal is higher than a voltage of a second voltage signal transmitted by the second voltage signal terminal. The electrostatic protection portion includes a second electrostatic protection sub-portion that is electrically connected to the mirror layer, the first voltage signal terminal and the second voltage signal terminal. The second electrostatic protection sub-portion includes at least one electrostatic protection circuit. An electrostatic protection circuit in the at least one electrostatic protection circuit includes at least one first transistor electrically connected to the mirror layer and the first voltage signal terminal, and at least one second transistor electrically connected to the mirror layer and the second voltage signal terminal. The at least one first transistor is configured to be turned on in a case where a voltage of static electricity generated on the mirror layer is higher than the voltage of the first voltage signal, and transmit the static electricity to the first voltage signal terminal. The at least one second transistor is configured to be turned on in a case where the voltage of the static electricity generated on the mirror layer is lower than the voltage of the second voltage signal, and transmit the static electricity to the second voltage signal terminal.

In some embodiments, a sub-pixel in the plurality of sub-pixels includes a pixel driving circuit; the at least one first transistor, the at least one second transistor and the pixel driving circuit are synchronously formed.

In some embodiments, the bezel region is around the display region. The at least one electrostatic protection circuit includes a plurality of electrostatic protection circuits, the plurality of electrostatic protection circuits are arranged at intervals in the bezel region.

In some embodiments, the display region has a rectangular shape, and the bezel region is around the display region. In a case where the electrostatic protection portion includes the first electrostatic protection sub-portion and the second electrostatic protection sub-portion, and the second electrostatic protection sub-portion includes a plurality of electrostatic protection circuits, the first electrostatic protection sub-portion is disposed on a side of the display region, and the plurality of electrostatic protection circuits are evenly disposed on remaining sides of the display region.

In some embodiments, the display panel further includes a pixel define layer disposed between every two adjacent sub-pixels. An orthographic projection of the mirror layer on the substrate is located within an orthographic projection of the pixel define layer on the substrate; or the orthographic projection of the mirror layer on the substrate coincides with the orthographic projection of the pixel define layer on the substrate.

In another aspect, a display apparatus is provided. The display apparatus includes the display panel as described in any one of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on actual sizes of products involved in the embodiments of the present disclosure.

DETAILED DESCRIPTION

Figure 1:
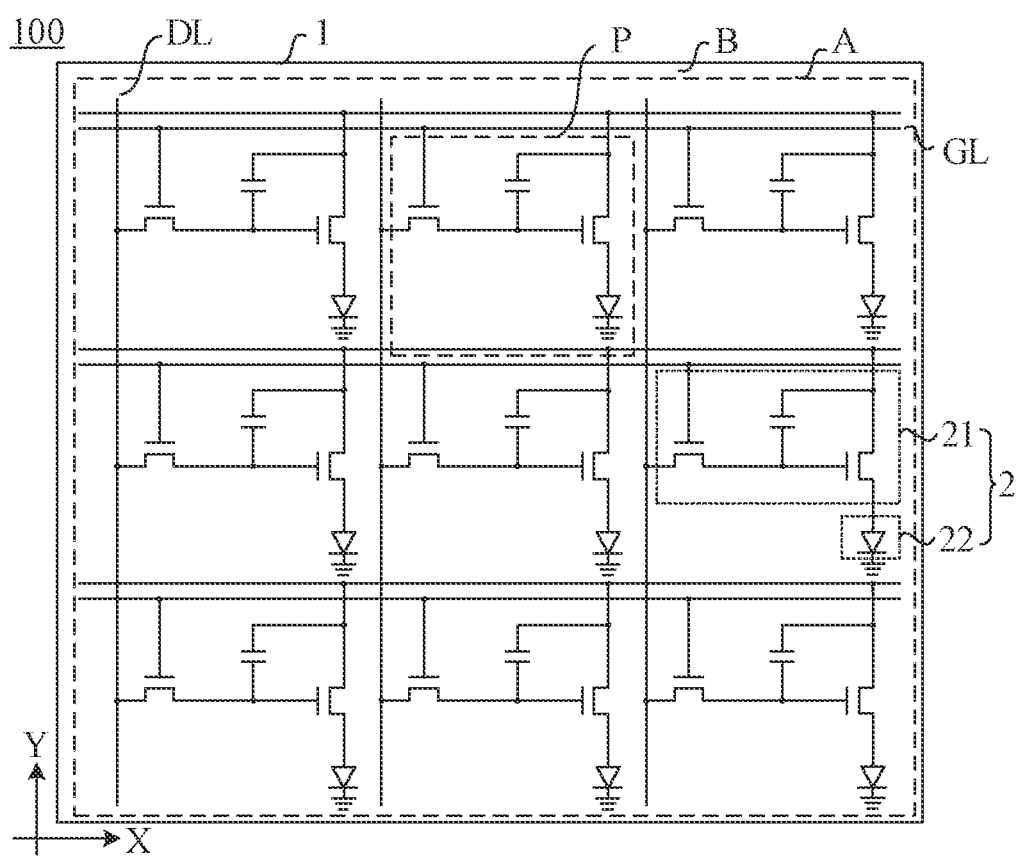
FIG. 1 is a structural diagram of a display panel, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment" "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, the term "connected" and derivatives thereof may be used. For example, the term "connected" may be used in the description of some embodiments to indicate that two or more components are in direct physical or electrical contact with each other. The embodiments disclosed herein are not necessarily limited to the content herein.

The phrase "A and/or B" includes following three combinations; only A, only B, and a combination of A and B.

As used herein, depending on the context, the term "if" is optionally construed to mean "when", "in a case where", "in response to determining" or "in response to detecting". Similarly, depending on the context, the phrase "if it is determined" or "if [a stated condition or event] is detected" is optionally construed as "in a case where it is determined", "in response to determining", "in a case where [the stated condition or event] is detected", or "in response to detecting [the stated condition or event]".

The phase "applicable to" or "configured to" used herein means an open and inclusive expression, which does not exclude devices that are applicable to or configured to perform additional tasks or steps.

In addition, the phrase "based on" used is meant to be open and inclusive, since processes, steps, calculations or other actions "based on" one or more of the stated conditions or values may, in practice, be based on additional conditions or values exceeding those stated.

As used herein, the term such as "about" or "approximately" includes a stated value and an average value within an acceptable range of deviation of a particular value. The acceptable range of deviation is determined by a person of ordinary skill in the art in view of the measurement in question and the error associated with the measurement of a particular quantity (i.e., the limitation of the measurement system).

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a feature of being curved. Therefore, the regions shown in the accompanying drawings are schematic in nature, and their shapes are not intended to show actual shapes of the regions in a device, and are not intended to limit the scope of the exemplary embodiments.

In the related art, a mirror layer of a mirror display apparatus is usually made of a metal material with a high light reflectivity. In processes of manufacturing, assembling, testing or transporting the mirror display apparatus, static electricity is easily generated and accumulated on the mirror layer of the mirror display apparatus. This easily causes an electrostatic discharge, and further easily causes a damage to devices (e.g., light-emitting devices or pixel driving circuits) in the mirror display apparatus and affects a normal use of the mirror display apparatus.

In light of this, some embodiments of the present disclosure provide a display panel 100. As shown in FIGS. 1 to 5 and 7, the display panel 100 has a display region A and a bezel region B located on side(s) of the display region A.

In some examples, the side(s) refers to one side, two sides, three sides or peripheral sides of the display region A (as shown in FIG. 1). This means that, the bezel region B may be located on one side, two sides or three sides of the display region A; or the bezel region B may be disposed around the display region A.

In some examples, as shown in FIGS. 1 to 5 and 7, the display panel 100 includes a substrate 1.

A structure of the substrate 1 varies, which may be set according to actual needs. For example, the substrate 1 may be a blank base substrate. As another example, the substrate 1 may include a blank base substrate and at least one functional film (e.g., an insulating layer and/or a buffer layer) disposed on the blank base substrate.

A type of the blank base substrate varies, which may be set according to actual needs.

For example, the blank base substrate may be a rigid base substrate. The rigid base substrate may be, for example, a glass base substrate or a polymethyl methacrylate (PMMA) base substrate.

As another example, the blank base substrate may be a flexible base substrate. The flexible base substrate may be, for example, a polyethylene terephthalate (PET) base substrate, a polyethylene naphthalate two formic acid glycol ester (PEN) base substrate or a polyimide (PI) base substrate.

In some examples, as shown in FIG. 1, the display panel 100 further includes a plurality of gate lines GL and a plurality of data lines DL that are disposed on a side of the substrate 1. The plurality of gate lines GL may extend in a first direction X, and the plurality of data lines DL may extend in a second direction Y. In addition, the plurality of data lines DL are located on a side of the plurality of gate lines GL away from the substrate 1, and the plurality of data lines DL are insulated from the plurality of gate lines GL.

For example, as shown in FIG. 1, the first direction X and the second direction Y intersect each other. That is, the plurality of gate lines GL and the plurality of data lines DL are arranged crosswise. The plurality of gate lines GL and the plurality of data lines DL may be used to define a plurality of sub-pixel regions P.

Here, a magnitude of an included angle between the first direction X and the second direction Y may be set according to actual needs. For example, the first direction X and the second direction Y may be perpendicular to each other. That is, the included angle between them is 90°. In this case, the plurality of gate lines GL are perpendicular to or approximately perpendicular to the plurality of data lines DL.

In some examples, as shown in FIG. 1, the display panel 100 further includes a plurality of sub-pixels 2 disposed on the side of the substrate 1 and located in the display region A.

For example, as shown in FIG. 1, the plurality of sub-pixels 2 may be located in the plurality of sub-pixel regions P, respectively. That is, the plurality of sub-pixels 2 are in one-to-one correspondence with the plurality of sub-pixel regions P.

For example, a structure of the sub-pixel 2 may be as follows. Each sub-pixel 2 includes a pixel driving circuit 21 and a light-emitting device 22 that is disposed on a side of the pixel driving circuit 21 away from the substrate 1 and electrically connected to the pixel driving circuit 21. The pixel driving circuit 21 is configured to provide a driving voltage to the light-emitting device 22 that is electrically connected to the pixel driving circuit 21, so as to control the light-emitting state of the light-emitting device 22.

For example, as shown in FIG. 1, sub-pixel regions P arranged in a row in the first direction X may be referred to as a same row of sub-pixel regions P, and sub-pixel regions P arranged in a column in the second direction Y may be referred to as a same column of sub-pixel regions P. Pixel driving circuits 21 in the same row of sub-pixel regions P may be electrically connected to a gate line GL, and pixel driving circuits 21 in the same column of sub-pixel regions P may be electrically connected to a data line DL.

Of course, the pixel driving circuits 21 in the same row of sub-pixel regions P may also be electrically connected to gate lines GL, which are not limited in the embodiments of the present disclosure.

A structure of the pixel driving circuit 21 varies, which may be set according to actual needs. For example, the pixel driving circuit 21 may be of a structure with "2T1C", "6T1C", "7T1C", "6T2C", or "7T2C". Here, "T" represents a thin film transistor, and the number before "T" represents the number of thin film transistors. "C" represents a storage capacitor, and the number before "C" represents the number of storage capacitor(s). A plurality of thin film transistors included in the pixel driving circuit 21 include a driving transistor and at least one switching transistor.

A type of the thin film transistor varies. For example, the thin film transistor may be a low temperature poly-silicon thin film transistor or an oxide thin film transistor.

A structure of the light-emitting device 22 varies, which may be set according to actual needs.

Figure 4:
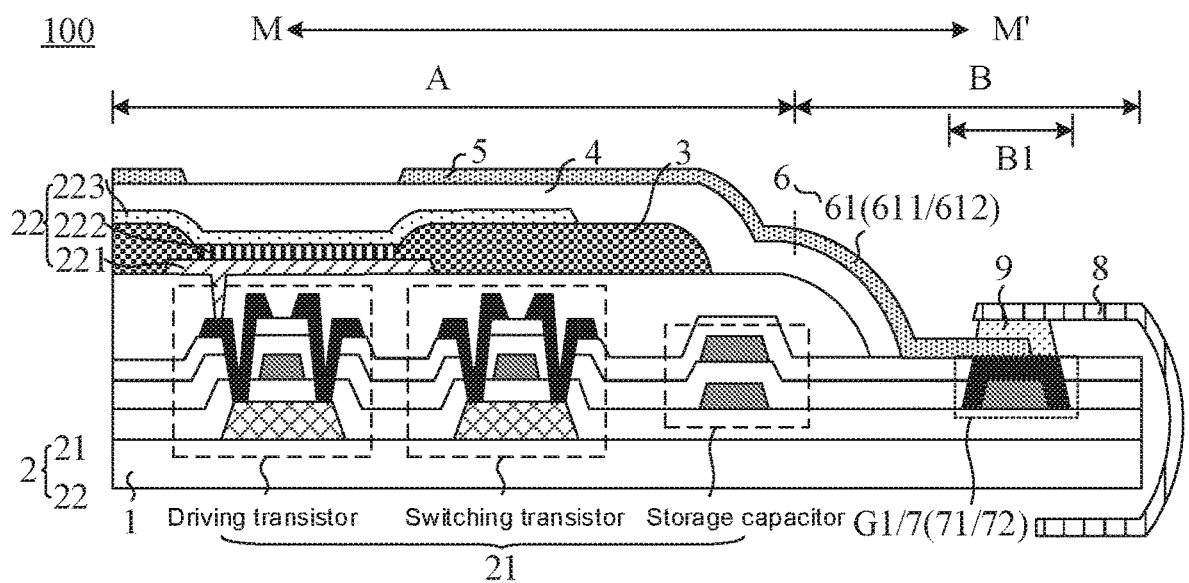
FIG. 4 is a sectional view of the display panel shown in FIG. 3 taken along the M-M' direction.

For example, as shown in FIG. 4, the light-emitting device 22 includes an anode layer 221 disposed on the side of the pixel driving circuit 21 away from the substrate 1 and electrically connected to the driving transistor of the pixel driving circuit 21, and a light-emitting layer 222 and a cathode layer 223 that are stacked on a side of the anode layer 221 away from the substrate 1 in sequence.

For example, the light-emitting device 22 may further include a hole injection layer and/or a hole transport layer disposed between the anode layer 221 and the light-emitting layer 222. The light-emitting device 22 may further include an electron transport layer and/or an electron injection layer disposed between the light-emitting layer 222 and the cathode layer 223.

A structure of the light-emitting layer 222 varies. For example, the light-emitting layer 222 may be an organic light-emitting layer that is made of an organic material. In this case, the light-emitting device 22 may be referred to as an organic light-emitting diode (OLED) light-emitting device. As another example, the light-emitting layer 222 may be an inorganic light-emitting layer that is made of a quantum dot material. In this case, the light-emitting device 22 may be referred to as a quantum dot light-emitting diode (QLED) light-emitting device.

The light-emitting device 22 may be a top-emission light-emitting device or a bottom-emission light-emitting device. In embodiments of the present disclosure, a structure of the display panel 100 is schematically described by taking an example in which the light-emitting device 22 is the top-emission light-emitting device.

In some examples, as shown in FIG. 4, the display panel 100 further includes a pixel define layer 3 disposed between every two adjacent sub-pixels 2.

Here, in the case where the sub-pixel 2 includes the pixel driving circuit 21 and the light-emitting device 22, the pixel define layer 3 may be located on a side of a plurality of pixel driving circuits 21 away from the substrate 1, and located between every two adjacent light-emitting devices 22.

In some examples, as shown in FIG. 4, the display panel 100 further includes an encapsulation layer 4 disposed on a side of the plurality of sub-pixels 2 and the pixel define layer 3 away from the substrate 1.

For example, the encapsulation layer 4 covers the plurality of sub-pixels 2. That is, orthographic projections of the plurality of sub-pixels 2 on the substrate 1 are located within an orthographic projection of the encapsulation layer 4 on the substrate 1. In this way, the encapsulation layer 4 may be used to encapsulate and protect the plurality of sub-pixels 2, so as to prevent external water vapor and/or oxygen from corroding light-emitting devices 22 of the plurality of sub-pixels 2, and thus avoid affecting the luminous efficiency and the service life of the display panel 100.

In some examples, as shown in FIG. 4, the display panel 100 further includes a mirror layer 5 disposed on a side of the plurality of sub-pixels 2 away from the substrate 1.

The mirror layer 5 may be located within the display region A. Alternatively, an outer edge of an orthographic projection of the mirror layer 5 on the substrate 1 coincides with an edge of the display region A.

Of course, a portion of the mirror layer 5 may be located within the display region A, and another portion of the mirror layer 5 may be located within the bezel region B.

For example, as shown in FIG. 4, the mirror layer 5 may be located on a side of the encapsulation layer 4 away from the substrate 1, and be in direct contact with a surface of the encapsulation layer 4 away from the substrate 1.

The mirror layer 5 is configured to reflect external ambient light incident on the mirror layer 5. In this way, the display function may be achieved by using the plurality of sub-pixels 2; and in addition, the mirror function of the display panel 100 may be achieved by using the mirror layer 5.

A material of the mirror layer 5 varies, which may be selected according to actual needs, as long as the mirror layer 5 has a relatively high light reflectivity and can achieve a good reflection effect.

For example, the material of the mirror layer 5 may include at least one of aluminum, silver, titanium and molybdenum.

A positional relationship between the mirror layer 5 and the pixel define layer 3 varies, which may be set according to actual needs.

Figure 9:
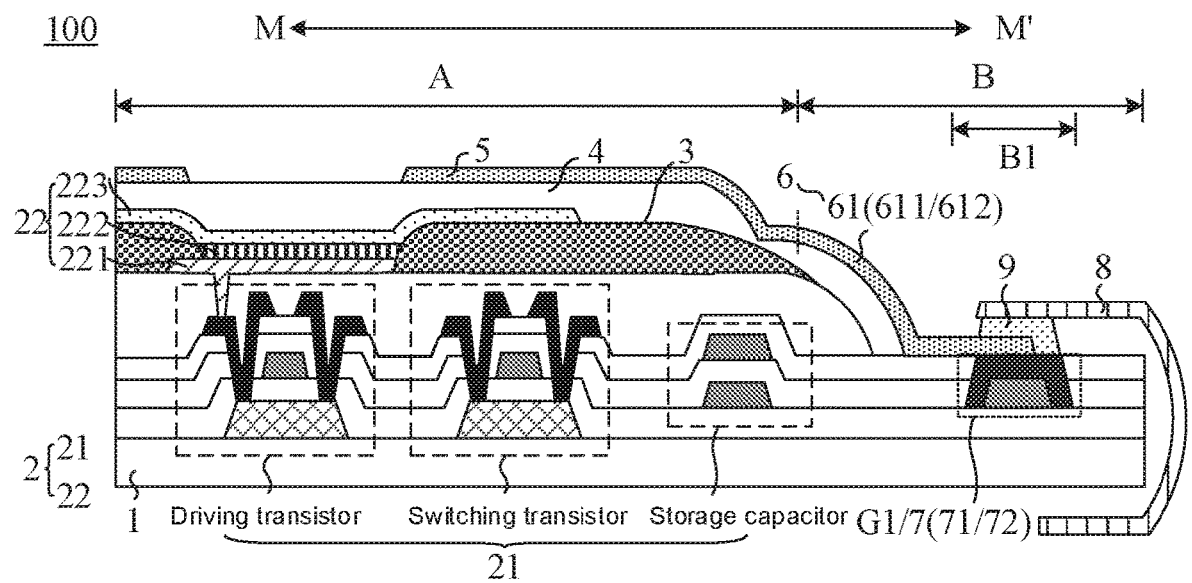
FIG. 9 is another sectional view of the display panel shown in FIG. 3 taken along the M-M' direction.
Figure 10:
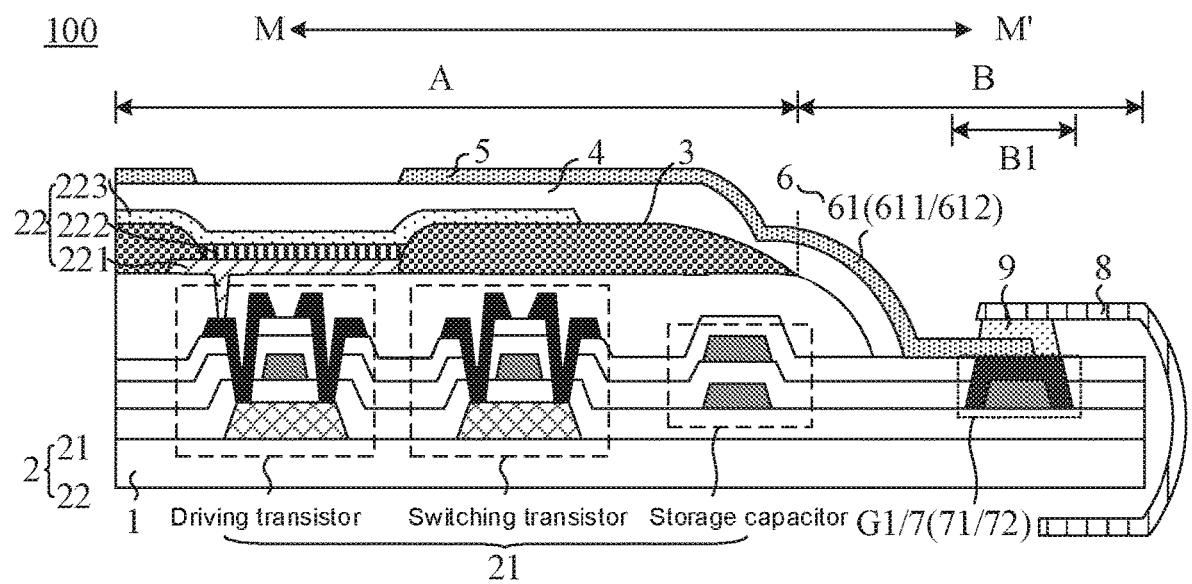
FIG. 10 is yet another sectional view of the display panel shown in FIG. 3 taken to along the M-M' direction.

For example, as shown in FIG. 9, the orthographic projection of the mirror layer 5 on the substrate 1 is located within an orthographic projection of the pixel define layer 3 on the substrate 1; or as shown in FIG. 10, the orthographic projection of the mirror layer 5 on the substrate 1 coincides with the orthographic projection of the pixel define layer 3 on the substrate 1.

In this way, it may prevent the mirror layer 5 from shading the light-emitting devices 22 of the sub-pixels 2, and thus prevent the mirror layer 5 from shading light emitted from the light-emitting devices 22. This ensures that the light emitted from the light-emitting devices 22 can normally exit from a light-exit side of the display panel 100, which may avoid affecting the display effect of the display panel 100.

In some examples, as shown in FIGS. 2 to 5 and 7, the display panel 100 further includes an electrostatic protection portion 6 electrically connected to the mirror layer 5 and located in the bezel region B. The electrostatic protection portion 6 is configured to provide electrostatic protection for the mirror layer 5.

By arranging the electrostatic protection portion 6 in the bezel region B, it may be possible to avoid that the electrostatic protection portion 6 occupies an area of the display region A, so that the display panel 100 has a relatively large screen-to-body ratio.

It will be noted that, since the mirror layer 5 is made of the metal material with a high light reflectivity, static electricity is easily generated and accumulated on the mirror layer 5. By arranging the electrostatic protection portion 6 electrically connected to the mirror layer 5, it may be possible to use the electrostatic protection portion 6 to release the static electricity, so that the mirror layer 5 may be electrostatically protected, and the electrostatic discharge phenomenon is avoided.

Based on this, for the display panel 100 provided in the embodiments of the present disclosure, by arranging the electrostatic protection portion 6 electrically connected to the mirror layer 5 and located in the bezel region B, it avoids that the electrostatic protection portion 6 occupies the area of the display region A, and the electrostatic protection portion 6 is used to provide electrostatic protection for the mirror layer 5. In this way, it may be possible to avoid the accumulation of the static electricity generated on the mirror layer 5, and further avoid the electrostatic discharge phenomenon. As a result, it avoids the damage to a device structure in the display panel 100 due to the electrostatic discharge, and a normal use of the display panel 100 is ensured.

A structure of the electrostatic protection portion 6 varies, which may be set according to actual needs.

In some embodiments, as shown in FIGS. 2 to 5 and 7, the electrostatic protection portion 6 includes a first electrostatic protection sub-portion 61 and/or a second electrostatic protection sub-portion 62. That is, the electrostatic protection portion 6 may include the first electrostatic protection sub-portion 61; or the electrostatic protection portion 6 may include the second electrostatic protection sub-portion 62; or the electrostatic protection portion 6 may include both the first electrostatic protection sub-portion 61 and the second electrostatic protection sub-portion 62.

Structures of the first electrostatic protection sub-portion 61 and the second electrostatic protection sub-portion 62 may be schematically described below with reference to accompanying drawings.

Figure 2:
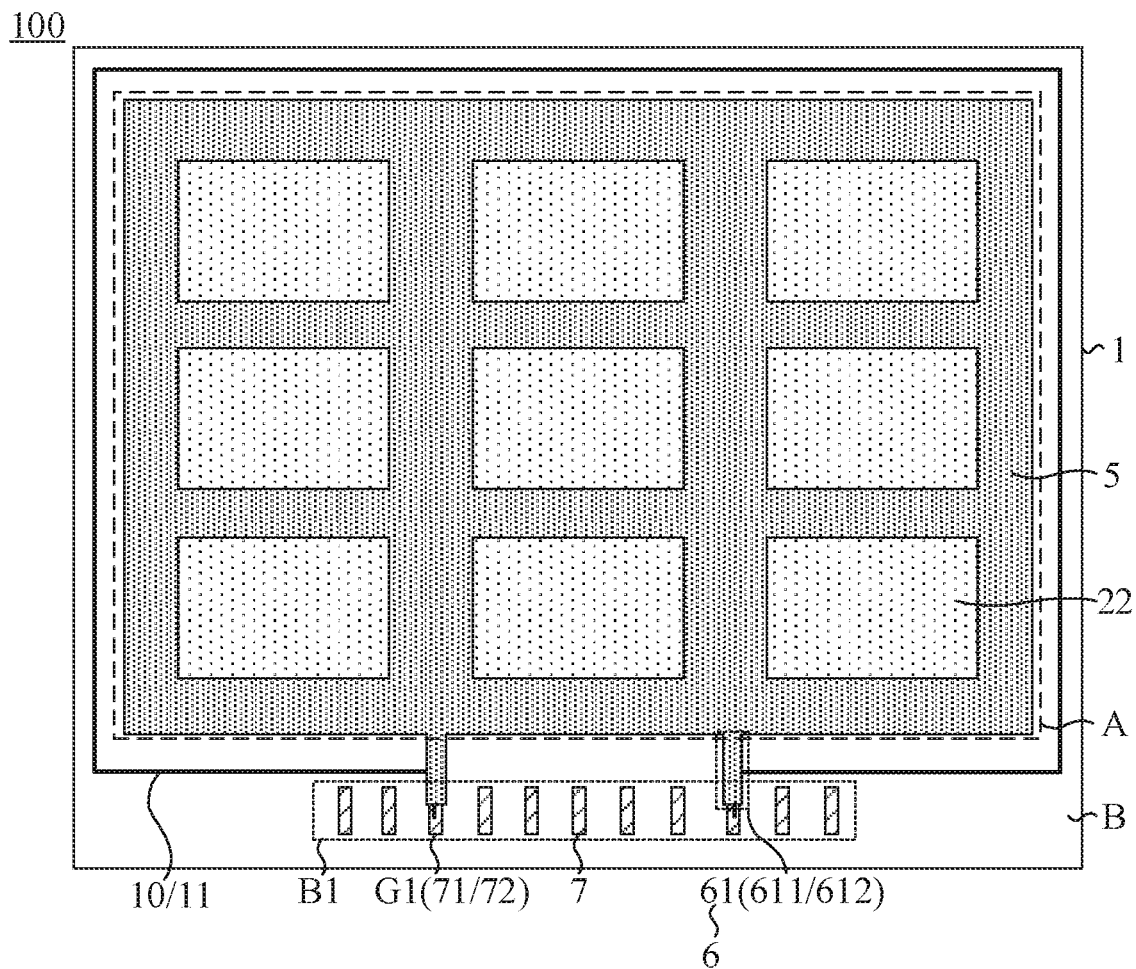
FIG. 2 is a structural diagram of another display panel, in accordance with some embodiments of the present disclosure.
Figure 3:
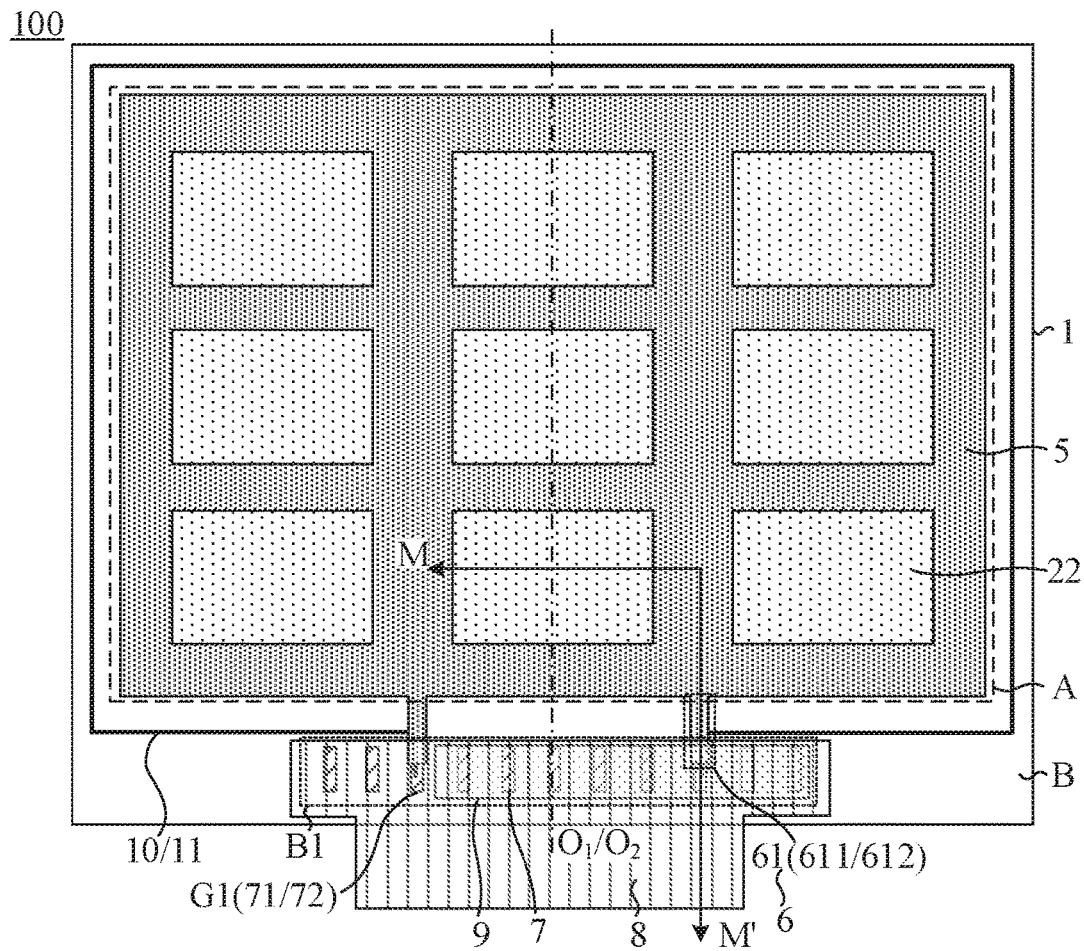
FIG. 3 is a structural diagram of yet another display panel, in accordance with some embodiments of the present disclosure.

In an implementation, as shown in FIGS. 2 and 3, the bezel region B includes a bonding region B1. The display panel 100 has at least one first fixed voltage signal terminal G1 disposed in the bonding region B1. That is, there may be one or more first fixed voltage signal terminals G1.

Based on this, as shown in FIGS. 2 and 3, the electrostatic protection portion 6 may include the first electrostatic protection sub-portion 61. The first electrostatic protection sub-portion 61 is electrically connected to the mirror layer 5 and the first fixed voltage signal terminal(s) G1. The first electrostatic protection sub-portion 61 is configured to transmit the static electricity generated on the mirror layer 5 to the first fixed voltage signal terminal(s) G1.

In some examples, as shown in FIG. 3, the display panel 100 further includes a plurality of pins 7 disposed in the bonding region B1, and a flexible printed circuit (FPC) 8 bonded to the plurality of pins 7. The FPC 8 may transmit electrical signals to the plurality of pins 7. Alternatively, electrical signals transmitted to the plurality of pins 7 may be transmitted to the FPC 8.

In some examples, as shown in FIG. 3, the display panel 100 further includes a chip on film (COF, which is also referred to as chip on flex) 9 bonded to the plurality of pins 7. The FPC 8 may be bonded to the plurality of pins 7 through the COF 9, so that the FPC 8 may transmit the electrical signals to the plurality of pins 7 through the COF 9, or the electrical signals transmitted to the plurality of pins 7 may be transmitted to the FPC 8 through the COF 9.

It will be noted that, a type of the first fixed voltage signal terminal G1 varies, and the structure of the display panel 100 varies.

In some embodiments, as shown in FIGS. 2 and 3, the display panel 100 further includes at least one low power supply voltage signal line 10 disposed in the bezel region B. For example, the low power supply voltage signal line 10 may be disposed around the display region A, or may be disposed on a side of the display region A.

The plurality of pins 7 may include at least one first conductive pin 71. The at least one low power supply voltage signal line 10 may be electrically connected to the at least one first conductive pin 71. The at least one low power supply voltage signal line 10 may be electrically connected to the at least one first conductive pin 71 in one-to-one correspondence. Alternatively, a single first conductive pin 71 may be electrically connected to a plurality of low power supply voltage signal lines 10.

For example, the FPC 8 has a low power supply voltage signal point. The FPC 8 is configured to transmit, by the low power supply voltage signal point, a low power supply voltage signal (VSS) to the low power supply voltage signal line(s) 10 directly through the at least one first conductive pin 71, or through the COF 9 and the at least one first conductive pin 71 in sequence.

In this case, in the at least one first conductive pin 71, at least one first conductive pin 71 may serve as the first fixed voltage signal terminal(s) G1. That is, in a case where there is one first conductive pin 71, the one first conductive pin 71 serves as a first fixed voltage signal terminal G1; and in a case where there are a plurality of first conductive pins 71, at least one first conductive pin 71 in the plurality of first conductive pins 71 serves as the first fixed voltage signal terminal(s) G1.

In some examples, the first electrostatic protection sub-portion 61 may include at least one first lead 611. The at least one first lead 611 is electrically connected to the mirror layer 5 and the first conductive pin(s) 71 that serve as the first fixed voltage signal terminal(s) G1.

For example, a connection relationship between the first lead(s) 611 and the first conductive pin(s) 71 that serve as the first fixed voltage signal terminal(s) G1 may be as follows. The first lead(s) 611 are electrically connected to the first conductive pin(s) 71 in one-to-one correspondence. Alternatively, a single first conductive pin 71 may be electrically connected to a plurality of first leads 611.

In this case, the first lead 611 is configured to transmit the static electricity generated on the mirror layer 5 to the low power supply voltage signal point of the FPC 8 through the first conductive pin 71, or through the first conductive pin 71 and the COF 9 in sequence. In this way, the first lead 611 may be used to release the static electricity generated on the mirror layer 5, which avoids the accumulation of the static electricity generated on the mirror layer 5, and further avoids the electrostatic discharge phenomenon.

For example, the first lead 611 may be arranged in such a way that the first lead 611 and the mirror layer 5 are made of a same material and disposed in a same layer.

It will be noted that, the "same layer" mentioned herein refers to a layer structure that is formed by performing, using a same mask, a single patterning process on a film layer for forming specific patterns that is formed by a same film forming process. Depending on the specific patterns, the single patterning process may include several exposure, development or etching processes, and the specific patterns in the formed layer structure may be continuous or discontinuous, and these specific patterns may also be at different heights or have different thicknesses. In this way, the first lead 611 and the mirror layer 5 may be synchronously formed in one patterning process, which helps simplify the manufacturing process of the display panel 100.

Optionally, the first lead 611 and the mirror layer 5 may constitute a one-piece structure. That is, after the first lead 611 and the mirror layer 5 are formed, patterns corresponding to the two are continuous and disconnected.

For example, considering the material for forming the mirror layer 5, a metal film may be formed on the surface of the encapsulation layer 4 away from the substrate 1 by using a sputtering process, and then the metal film is patterned by using a photolithography process, so that the mirror layer 5 and the first lead 611 are formed. In this way, a shape of the metal film matches a shape of the surface of the encapsulation layer 4 away from the substrate 1. After the mirror layer 5 and the first lead 611 are formed, the first lead 611 may be in contact with a side face of the encapsulation layer 4 and extends to the bonding region B1 along the side face of the encapsulation layer 4.

For example, the side face of the encapsulation layer 4 refers to partial surface, located in the bezel region B and having a slope relative to the substrate 1, of the surface of the encapsulation layer 4 away from the substrate 1. In addition, the partial surface and the substrate 1 have an included angle therebetween.

It can be understood that, since the first lead 611 and the mirror layer 5 are made of the same material and disposed in the same layer, and the first lead 611 extends to the bonding region B1 along the side face of the encapsulation layer 4 and is electrically connected to the first conductive pin 71, during a process for manufacturing the plurality of sub-pixels 2 of the display panel 100, reworking of the mask that is used may be avoided. For example, reworking of a mask that is used to form, but not limited to, a source-drain conductive layer, a planarization layer or the pixel define layer 3 may be avoided, thereby avoiding a significant increase in the manufacture cost of the display panel 100, and improving the universality of the display panel 100.

In some other embodiments, as shown in FIGS. 2 and 3, the display panel 100 further includes at least one grounding line 11 disposed in the bezel region B. For example, the grounding line 11 may be disposed around the display region A, or may be disposed on a side of the display region A.

The plurality of pins 7 may include at least one second conductive pin 72. The at least one grounding line 11 may be electrically connected to the at least one second conductive pin 72. The at least one grounding line 11 may be electrically connected to the at least one second conductive pin 72 in one-to-one correspondence. Alternatively, a single second conductive pin 72 may be electrically connected to a plurality of grounding lines 11.

For example, the FPC 8 has a grounding line point. In this way, the at least one grounding line 11 may be connected to the grounding line point of the FPC 8 through the at least one second conductive pin 72 and the COF 9 in sequence, so that the grounding line 11 is grounded. Thus, ground protection may be performed on the display panel 100.

In this case, in the at least one second conductive pin 72, at least one second conductive pin 72 may serve as the first fixed voltage signal terminal(s) G1. That is, in a case where there is one second conductive pin 72, the one second conductive pin 72 serves as a first fixed voltage signal terminal G1; and in a case where there are a plurality of second conductive pins 72, at least one second conductive pin 72 in the plurality of second conductive pins 72 serves as the first fixed voltage signal terminal(s) G1.

In some examples, the first electrostatic protection sub-portion 61 may include at least one second lead 612. The at least one second lead 612 is electrically connected to the mirror layer 5 and the second conductive pin(s) 72 that serve as the first fixed voltage signal terminal(s) G1.

For example, a connection relationship between the second lead(s) 612 and the second conductive pin(s) 72 that serve as the first fixed voltage signal terminal(s) G1 may be as follows. The second lead(s) 612 are electrically connected to the second conductive pin(s) 72 in one-to-one correspondence. Alternatively, a single second conductive pin 72 may be electrically connected to a plurality of second leads 612.

In this case, the second lead 612 is configured to transmit the static electricity generated on the mirror layer 5 to the grounding line point of the FPC 8 through the second conductive pin 72 and the COF 9 in sequence. In this way, the second lead 612 may be used to release the static electricity generated on the mirror layer 5, which avoids the accumulation of the static electricity generated on the mirror layer 5, and further avoids the electrostatic discharge phenomenon.

For example, the second lead 612 may be arranged in such a way that the second lead 612 and the mirror layer 5 are made of a same material and disposed in a same layer.

In this way, the second lead 612 and the mirror layer 5 may be synchronously formed in one patterning process, which helps simplify the manufacturing process of the display panel 100.

Optionally, the second lead 612 and the mirror layer 5 may constitute a one-piece structure. That is, after the second lead 612 and the mirror layer 5 are formed, patterns corresponding to the two are continuous and disconnected.

For example, considering the material for forming the mirror layer 5, a metal film may be formed on the surface of the encapsulation layer 4 away from the substrate 1 by using a sputtering process, and then the metal film is patterned by using a photolithography process, so that the mirror layer 5 and the second lead 612 are formed. In this way, a shape of the metal film matches the shape of the surface of the encapsulation layer 4 away from the substrate 1. After the mirror layer 5 and the second lead 612 are formed, the second lead 612 may be in contact with the side face of the encapsulation layer 4 and extends to the bonding region B1 along the side face of the encapsulation layer 4.

Here, for the description of the side face of the encapsulation layer 4, reference may be made to the schematic descriptions in the above examples, and details will not be repeated here.

It can be understood that, since the second lead 612 and the mirror layer 5 are made of the same material and disposed in the same layer, and the second lead 612 extends to the bonding region B1 along the side face of the encapsulation layer 4 and is electrically connected to the second conductive pin 72, during the process for manufacturing the plurality of sub-pixels 2 of the display panel 100, reworking of the mask that is used may be avoided. For example, reworking of the mask that is used to form, but not limited to, the source-drain conductive layer, the planarization layer or the pixel define layer 3 may be avoided, thereby avoiding a significant increase in the manufacture cost of the display panel 100, and improving the universality of the display panel 100.

In some examples, a relative positional relationship between the display region A and the bonding region B1 in the bezel region B varies, which may be set according to actual needs.

Optionally, there may be one or more bonding regions B1. The bonding region(s) B1 may be located on a side of the display region A. Alternatively, in a case where there are a plurality of bonding regions B1, the plurality of bonding regions B1 may be respectively located on different sides of the display region A.

As shown in FIG. 3, in an example where there is one bonding region B1 and the bonding region B1 is located on the side of the display region A, in a direction in which the bonding region B1 and the display region A are arranged, a bisector $O_1$ of the display region A coincides or substantially coincides with a bisector $O_2$ of the bonding region B1. For example, a shape of the display region A may be symmetrically arranged relative to the bisector $O_1$ thereof, and a shape of the bonding region B1 may be symmetrically arranged relative to the bisector $O_2$ thereof.

In this case, the first electrostatic protection sub-portion 61 may be arranged in following manners.

As shown in FIG. 3, in the case where the first electrostatic protection sub-portion 61 includes the at least one first lead 611, and the number of the first lead(s) 611 is multiple, the multiple first leads 611 are symmetrically distributed relative to the bisector $O_1$ of the display region A. As shown in FIG. 3, in the case where the first electrostatic protection sub-portion 61 includes the at least one second lead 612, and the number of the second lead(s) 612 is multiple, the multiple second leads 612 are symmetrically distributed relative to the bisector $O_1$ of the display region A.

In this way, it is beneficial to improve the uniformity of the distribution of the first leads 611 or the second leads 612 included in the first electrostatic protection sub-portion 61, and improve the symmetrical distribution of the lines of the display panel 100.

Figure 5:
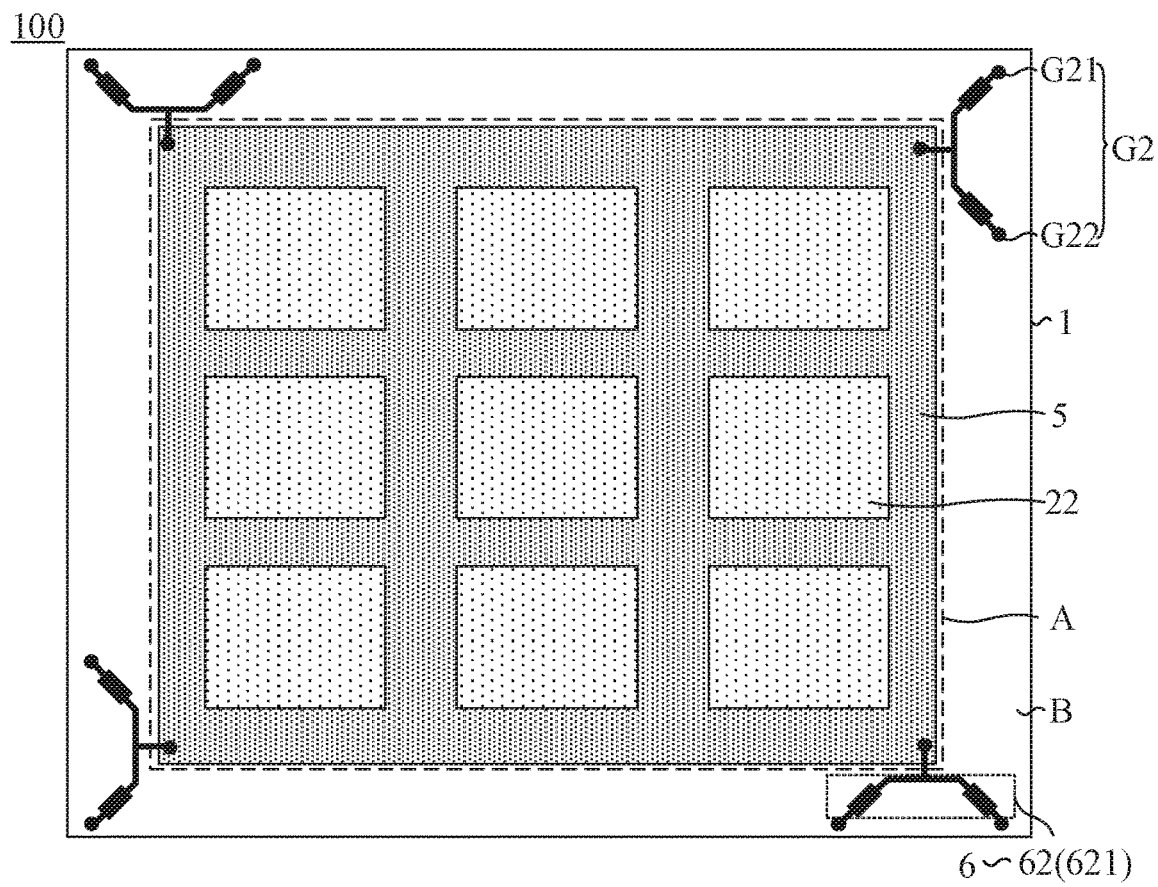
FIG. 5 is a structural diagram of yet another display panel, in accordance with some embodiments of the present disclosure.
Figure 6:
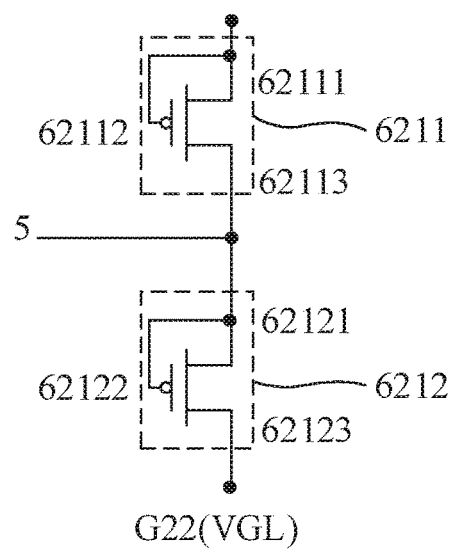
FIG. 6 is a diagram illustrating a circuit and an equivalent circuit of a second electrostatic protection sub-portion, in accordance with some embodiments of the present disclosure.
Figure 6:
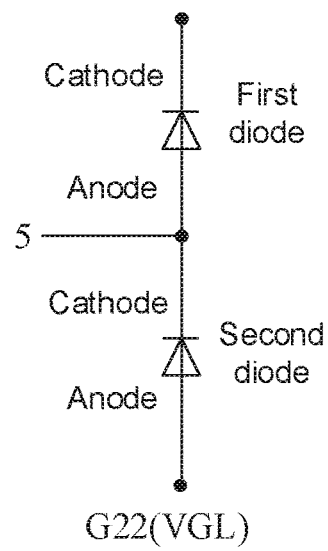
Figure 7:
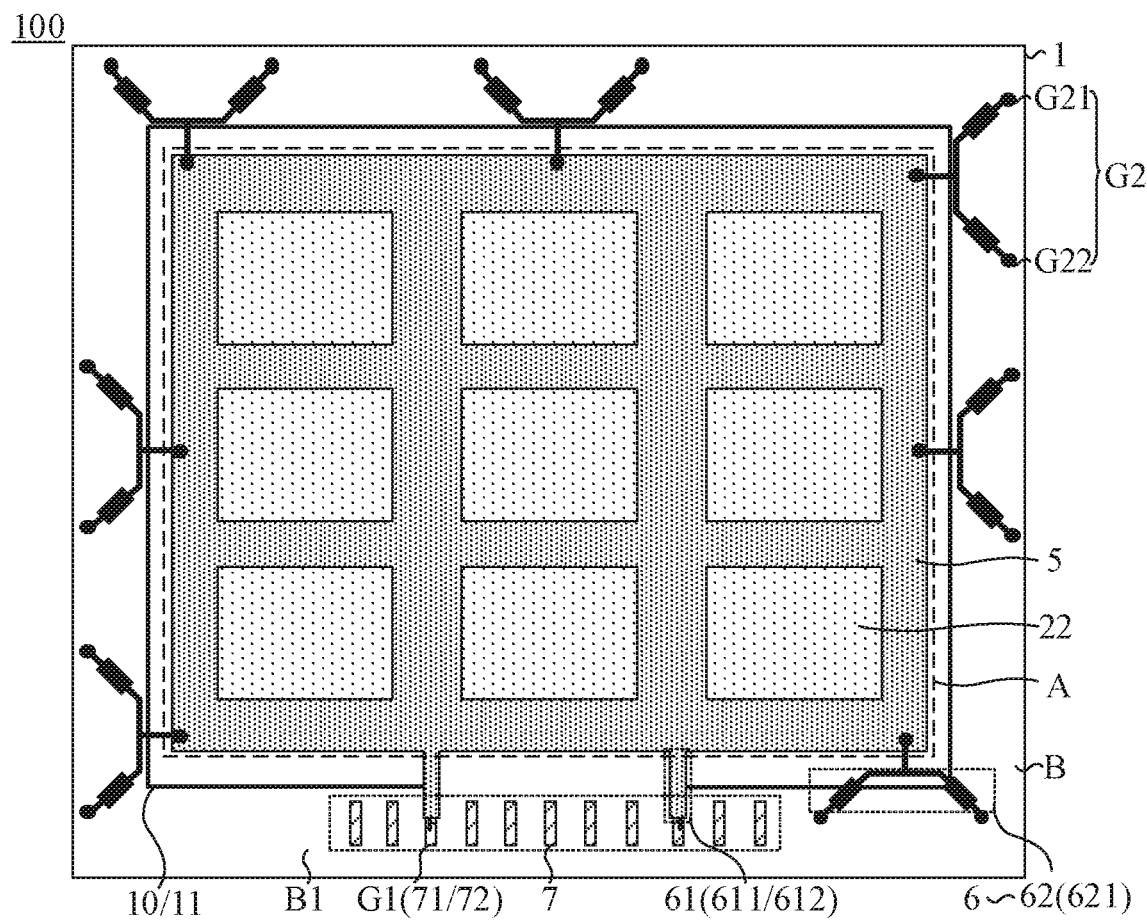
FIG. 7 is a structural diagram of yet another display panel, in accordance with some embodiments of the present disclosure.

In another implementation, as shown in FIGS. 5 and 7, the display panel 100 has a plurality of second fixed voltage signal terminals G2 disposed in the bezel region B. The plurality of second fixed voltage signal terminals G2 may include a first voltage signal terminal G21 and a second voltage signal terminal G22. As shown in FIG. 6, a voltage of a first voltage signal (which may, for example, be represented by VGH) transmitted by the first voltage signal terminal G21 is higher than a voltage of a second voltage signal (which may, for example, be represented by VGL) transmitted by the second voltage signal terminal G22.

Based on this, as shown in FIGS. 5 and 7, the electrostatic protection portion 6 may include the second electrostatic protection sub-portion 62. The second electrostatic protection sub-portion 62 is electrically connected to the mirror layer 5, the first voltage signal terminal G21 and the second voltage signal terminal G22.

It will be noted that, the static electricity generated on the mirror layer 5 may be positive static electricity or negative static electricity.

In this case, the second electrostatic protection sub-portion 62 may be configured to transmit the static electricity generated on the mirror layer 5 to the first voltage signal terminal G21 in a case where a voltage of the static electricity is higher than the voltage of the first voltage signal VGH (that is, the static electricity generated on the mirror layer 5 is the positive static electricity). The second electrostatic protection sub-portion 62 may be further configured to transmit the static electricity generated on the mirror layer 5 to the second voltage signal terminal G22 in a case where the voltage of the static electricity is lower than the voltage of the second voltage signal VGL (that is, the static electricity generated on the mirror layer 5 is the negative static electricity).

In this way, it may be possible to use the second electrostatic protection sub-portion 62 to release the static electricity generated on the mirror layer 5, thereby avoiding the accumulation of the static electricity generated on the mirror layer 5, and thus avoiding the electrostatic discharge phenomenon inside the display panel 100.

In some examples, as shown in FIGS. 5 and 7, the second electrostatic protection sub-portion 62 includes at least one electrostatic protection circuit 621.

For example, as shown in FIG. 6, an electrostatic protection circuit 621 may include first transistor(s) 6211 and second transistor(s) 6212.

The first transistor 6211 is electrically connected to the mirror layer 5 and the first voltage signal terminal G21. The first transistor 6211 is configured to be turned on in the case where the voltage of the static electricity generated on the mirror layer 5 is higher than the voltage of the first voltage signal VGH, and transmit the static electricity to the first voltage signal terminal G21. That is, in the case where the static electricity generated on the mirror layer 5 is the positive static electricity, and the voltage of the positive static electricity is higher than the voltage of the first voltage signal VGH, the first transistor 6211 may be turned on under a voltage difference between the positive static electricity and the first voltage signal VGH, so as to release the positive static electricity.

The second transistor 6212 is electrically connected to the mirror layer 5 and the second voltage signal terminal G22. The second transistor 6212 is configured to be turned on in the case where the voltage of the static electricity generated on the mirror layer 5 is lower than the voltage of the second voltage signal VGL, and transmit the static electricity to the second voltage signal terminal G22. That is, in a case where the static electricity generated on the mirror layer 5 is the negative static electricity, and the voltage of the negative static electricity is lower than the voltage of the second voltage signal VGL, the second transistor 6212 may be turned on under a voltage difference between the second voltage signal VGL and the negative static electricity, so as to release the negative static electricity.

For example, both the first transistor 6211 and the second transistor 6212 may be thin film transistors, and types thereof may be the same as the type of the thin film transistors in the pixel driving circuit 21. In this way, the first transistor 6211, the second transistor 6212 and the pixel driving circuit 21 may be synchronously formed.

In this way, it is beneficial to simplify the manufacturing process of the display panel 100, avoid increasing the number of processes for manufacturing the display panel 100 due to the arrangement of the electrostatic protection circuit 621, and avoid affecting the production efficiency of the display panel 100.

The number of the first transistor(s) 6211 and the number of the second transistor(s) 6212 may be set according to actual needs.

For example, there may be one or more first transistors 6211, and there may be one or more second transistors 6212. In a case where there are a plurality of first transistors 6211, the plurality of first transistors 6211 are sequentially connected in series. In a case where there are a plurality of second transistors 6212, the plurality of second transistors 6212 are sequentially connected in series.

A connection relationship and an operation processes of the electrostatic protection circuit 621 are schematically described below by taking an example in which there are one first transistor 6211 and one second transistor 6212.

It will be noted that, the thin film transistor includes an N-type transistor or a P-type transistor. Conductive conditions of the N-type transistor and the P-type transistor are different.

A type of the first transistor 6211 and a type of the second transistor 6212 may be the same or different. Some embodiments of the present disclosure are described by taking an example in which the two are of a same type.

As shown in FIG. 6, a first electrode 62111 and a control electrode 62112 of the first transistor 6211 are electrically connected, and are electrically connected to the first voltage signal terminal G21; and a second electrode 62113 of the first transistor 6211 is electrically connected to the mirror layer 5. A first electrode 62121 and a control electrode 62122 of the second transistor 6212 are electrically connected, and are electrically connected to the mirror layer 5; and a second electrode 62123 of the second transistor 6212 is electrically connected to the second voltage signal terminal G22.

Here, the control electrode 62112 of the first transistor 6211 is a gate of the first transistor 6211, and the control electrode 62122 of the second transistor 6212 is a gate of the second transistor 6212.

In a case where the first transistor 6211 and the second transistor 6212 are both P-type transistors, the first electrode 62111 of the first transistor 6211 is a drain of the first transistor 6211, and the second electrode 62113 of the first transistor 6211 is a source of the first transistor 6211; the first electrode 62121 of the second transistor 6212 is a drain of the second transistor 6212, and the second electrode 62123 of the second transistor 6212 is a source of the second transistor 6212.

In a case where the first transistor 6211 and the second transistor 6212 are both N-type transistors, the first electrode 62111 of the first transistor 6211 is the source of the first transistor 6211, and the second electrode 62113 of the first transistor 6211 is the drain of the first transistor 6211; the first electrode 62121 of the second transistor 6212 is the source of the second transistor 6212, and the second electrode 62123 of the second transistor 6212 is the drain of the second transistor 6212.

In an example where the first transistor 6211 and the second transistor 6212 are both P-type transistors. After the first electrode 62111 and the control electrode 62112 of the first transistor 6211 are electrically connected, the first transistor 6211 may be equivalent to a first diode, the first electrode 62111 and the control electrode 62112 of the first transistor 6211 are together equivalent to a cathode of the first diode, and the second electrode 62113 of the first transistor 6211 is equivalent to an anode of the first diode. After the first electrode 62121 and the control electrode 62122 of the second transistor 6212 are electrically connected, the second transistor 6212 may be equivalent to a second diode, the first electrode 62121 and the control electrode 62122 of the second transistor 6212 are together equivalent to a cathode of the second diode, and the second electrode 62123 of the second transistor 6212 is equivalent to an anode of the second diode.

In this way, in a case where the static electricity is generated on the mirror layer 5, and the voltage of the static electricity generated on the mirror layer 5 is higher than the voltage of the first voltage signal VGH, the first transistor 6211 is turned on, and the static electricity (i.e., the positive static electricity) is transmitted from the mirror layer 5 to the first voltage signal terminal G21 through the source of the first transistor 6211 and the drain of the first transistor 6211 in sequence, so that the static electricity is released, and a potential of the mirror layer 5 is reduced.

In the case where the voltage of the static electricity generated on the mirror layer 5 is lower than the voltage of the second voltage signal VGL, the second transistor 6212 is turned on, and the static electricity (i.e., the negative static electricity) is transmitted from the mirror layer 5 to the second voltage signal terminal G22 through the drain of the second transistor 6212 and the source of the second transistor 6212 in sequence, so that the static electricity is released. That is, the second voltage signal VGL transmitted by the second voltage signal terminal G22 is transmitted to the mirror layer 5 through the source of the second transistor 6212 and the drain of the second transistor 6212 in sequence, so that the potential of the mirror layer 5 is raised.

In this way, the mirror layer 5 is electrostatically protected.

It will be noted that, the number of the electrostatic protection circuit(s) 621 may be one or more.

In some examples, in a case where there are a plurality of electrostatic protection circuits 621, the plurality of electrostatic protection circuits 621 may be disposed at intervals in the bezel region B. This is beneficial to improve the electrostatic protection effect of the second electrostatic protection sub-portion 62 on the mirror layer 5.

For example, as shown in FIG. 5, the bezel region B is around the display region A. The plurality of electrostatic protection circuits 621 may be disposed at intervals in the bezel region B. That is, the plurality of electrostatic protection circuits 621 may be disposed at intervals around the mirror layer 5.

In this way, in a case where the voltage of the static electricity generated at a certain position of the mirror layer 5 is higher than the voltage of the first voltage signal VGH or lower than the voltage of the second voltage signal VGL, the static electricity may be released through an electrostatic protection circuit 621 whose position is relatively close to the certain position, which effectively improves the efficiency of releasing the static electricity. As a result, the second electrostatic protection sub-portion 62 has a good electrostatic protection effect.

In addition, in a case where a certain electrostatic protection circuit 621 is abnormal, the static electricity may be released by another electrostatic protection circuit 621, so that the second electrostatic protection sub-portion 62 may have good reliability.

Optionally, as shown in FIG. 5, the display region A may have a rectangular shape. In this case, the number of the electrostatic protection circuits 621 may be, for example, four. The four electrostatic protection circuits 621 may be arranged at positions corresponding to four corners of the display region A. As shown in FIG. 7, the number of the electrostatic protection circuits 621 may be, for example, seven. Four electrostatic protection circuits 621 in the seven electrostatic protection circuits 621 may be arranged at the positions corresponding to the four corners of the display region A, and the other three electrostatic protection circuits 621 each may be arranged at a position between two adjacent corners in the four corners of the display region A. This is beneficial to improve the balance of the electrostatic release, and improve the electrostatic protection effect.

In some embodiments, in the case where the electrostatic protection portion 6 includes both the first electrostatic protection sub-portion 61 and the second electrostatic protection sub-portion 62, positions of the first electrostatic protection sub-portion 61 and the second electrostatic protection sub-portion 62 may be set according to actual needs.

In some examples, as shown in FIG. 7, the display region A may have the rectangular shape, and the bezel region B is around the display region A. In this case, the bonding region B1 of the bezel region B may be located on a side of the display region A.

Based on this, the first electrostatic protection sub-portion 61 may be disposed on the side of the display region A. In a case where the second electrostatic protection sub-portion 62 includes the plurality of electrostatic protection circuits 621 the plurality of electrostatic protection circuits 621 may be evenly arranged on remaining sides of the display region A.

Here, the remaining sides of the display region A refer to three sides of the display region A other than the side corresponding to the bonding region B1. The plurality of electrostatic protection circuits 621 being evenly arranged means, for example, that electrostatic protection circuits 621 located on a same side of the display region A are arranged at equal intervals.

Figure 8:
FIG. 8 is a structural diagram of a display apparatus, in accordance with some embodiments of the present disclosure.

Some embodiments of the present disclosure provide a display apparatus 1000. As shown in FIG. 8, the display apparatus 1000 includes the display panel 100 as described in any of the above embodiments.

Of course, the display apparatus 1000 may further include a housing for carrying the display panel 100.

Beneficial effects that can be achieved by the display apparatus 1000 provided in the embodiments of the present disclosure are the same as the beneficial effects that can be achieved by the display panel 100 provided in the above embodiments, and details will not be repeated here.

In some embodiments, the display apparatus 1000 may be any product or component having a display function, such as a mobile phone, a tablet computer, a television, a display, a notebook computer, a digital frame or a navigator.

The foregoing descriptions are merely specific implementations of the present disclosure, but the protection scope of the present disclosure is not limited thereto. Any changes or replacements that a person skilled in the art could conceive of within the technical scope of the present disclosure shad be included in the protection scope of the present disclosure. Therefore, the protection scope of the present disclosure shall be subject to the protection scope of the claims.

What is claimed is:

1. A display panel having a display region and a bezel region located on at least one side of the display region, the display panel comprising:
   a substrate;
   a plurality of sub-pixels disposed on a side of the substrate and located in the display region;
   a mirror layer disposed on a side of the plurality of sub-pixels away from the substrate and at least partially located in the display area; and
   an electrostatic protection portion electrically connected to the mirror layer and located in the bezel region;
   wherein the mirror layer is configured to reflect external ambient light incident on the mirror layer, and the electrostatic protection portion is configured to provide electrostatic protection for the mirror layer;
   the display panel has a plurality of second fixed voltage signal terminals that are disposed in the bezel region; the plurality of second fixed voltage signal terminals include a first voltage signal terminal and a second voltage signal terminal, and a voltage of a first voltage signal transmitted by the first voltage signal terminal is higher than a voltage of a second voltage signal transmitted by the second voltage signal terminal;
   the electrostatic protection portion includes a second electrostatic protection sub-portion that is electrically connected to the mirror layer, the first voltage signal terminal and the second voltage signal terminal;
   the second electrostatic protection sub-portion includes at least one electrostatic protection circuit;
   an electrostatic protection circuit in the at least one electrostatic protection circuit includes at least one first transistor electrically connected to the mirror layer and the first voltage signal terminal, and at least one second transistor electrically connected to the mirror layer and the second voltage signal terminal;
   the at least one first transistor is configured to be turned on in a case where a voltage of static electricity generated on the mirror layer is higher than the voltage of the first voltage signal, and transmit the static electricity to the first voltage signal terminal; and
   the at least one second transistor is configured to be turned on in a case where the voltage of the static electricity generated on the mirror layer is lower than the voltage of the second voltage signal, and transmit the static electricity to the second voltage signal terminal.

2. The display panel according to claim 1, wherein the bezel region includes a bonding region;
   the display panel further has at least one first fixed voltage signal terminal disposed in the bonding region, wherein the electrostatic protection portion further includes a first electrostatic protection sub-portion electrically connected to the mirror layer and the at least one first fixed voltage signal terminal; and
   the first electrostatic protection sub-portion is configured to transmit static electricity generated on the mirror layer to the at least one first fixed voltage signal terminal.

3. The display panel according to claim 2, further comprising:
   at least one low power supply voltage signal line disposed in the bezel region;
   at least one first conductive pin disposed in the bonding region and electrically connected to the at least one low power supply voltage signal line; and
   a flexible printed circuit bonded to the at least one first conductive pin, wherein the flexible printed circuit has a low power supply voltage signal point; and the flexible printed circuit is configured to transmit, by the low power supply voltage signal point, a low power supply voltage signal to the at least one low power voltage signal line through the at least one first conductive pin;
   wherein a first conductive pin in the at least one first conductive pin serves as a first fixed voltage signal terminal;
   the first electrostatic protection sub-portion includes at least one first lead, a first lead in the at least one first lead is electrically connected to the mirror layer and the first conductive pin serving as the first fixed voltage signal terminal; and
   the first lead is configured to transmit the static electricity generated on the mirror layer to the low power supply voltage signal point of the flexible printed circuit through the first conductive pin.

4. The display panel according to claim 3, further comprising a chip on film bonded to the at least one first conductive pin, wherein the flexible printed circuit is bonded to the at least one first conductive pin through the chip on film; and the first lead is configured to transmit the static electricity generated on the mirror layer to the low power supply voltage signal point of the flexible printed circuit through the first conductive pin and the chip on film.

5. The display panel according to claim 2, further comprising:

at least one grounding line disposed in the bezel region;

at least one second conductive pin disposed in the bonding region and electrically connected to the at least one grounding line;

a chip on film bonded to the at least one second conductive pin; and a flexible printed circuit bonded to the chip on film, the flexible printed circuit having a grounding line point;

wherein a second conductive pin in the at least one second conductive pin serves as a first fixed voltage signal terminal;

the first electrostatic protection sub-portion includes at least one second lead, a second lead is electrically connected to the mirror layer and the second conductive pin serving as the first fixed voltage signal terminal; and the second lead is configured to transmit the static electricity generated on the mirror layer to the grounding line point of the flexible printed circuit through the second conductive pin and the chip on film.

6. The display panel according to claim 3, wherein the at least one first lead and the mirror layer are made of a same material and disposed in a same layer.

7. The display panel according to claim 3, further comprising an encapsulation layer disposed between the plurality of sub-pixels and the mirror layer, and covering the plurality of sub-pixels, wherein the at least one first lead is in contact with a side face of the encapsulation layer and extend to the bonding region along the side face of the encapsulation layer.

8. The display panel according to claim 3, wherein in a direction in which the bonding region and the display region are arranged, a bisector of the display region substantially coincides with a bisector of the bonding region;

the at least one first lead includes a plurality of first leads, and the plurality of first leads are symmetrically distributed relative to the bisector of the display region.

9. The display panel according to claim 1, wherein a sub-pixel in the plurality of sub-pixels includes a pixel driving circuit;

the at least one first transistor, the at least one second transistor and the pixel driving circuit are synchronously formed.

10. The display panel according to claim 1, wherein the bezel region is around the display region;

the at least one electrostatic protection circuit includes a plurality of electrostatic protection circuits, and the plurality of electrostatic protection circuits are arranged at intervals in the bezel region.

11. The display panel according to claim 2, wherein the display region has a rectangular shape, and the bezel region is around the display region;

the at least one electrostatic protection circuit includes a plurality of electrostatic protection circuits, wherein the first electrostatic protection sub-portion is disposed on a side of the display region, and the plurality of electrostatic protection circuits are evenly disposed on remaining sides of the display region.

12. The display panel according to claim 1, further comprising a pixel define layer disposed between every two adjacent sub-pixels, wherein an orthographic projection of the mirror layer on the substrate is located within an orthographic projection of the pixel define layer on the substrate.

13. A display apparatus, comprising the display panel according to claim 1.

14. The display panel according to claim 5, wherein the at least one second lead and the mirror layer are made of a same material and disposed in a same layer.

15. The display panel according to claim 5, further comprising an encapsulation layer disposed between the plurality of sub-pixels and the mirror layer, and covering the plurality of sub-pixels, wherein the at least one second lead is in contact with a side face of the encapsulation layer and extend to the bonding region along the side surface of the encapsulation layer.

16. The display panel according to claim 5, wherein in a direction in which the bonding region and the display region are arranged, a bisector of the display region substantially coincides with a bisector of the bonding region;

the at least one second lead includes a plurality of second lead, and the plurality of second leads are symmetrically distributed relative to the bisector of the display region.

17. The display panel according to claim 1, further comprising a pixel define layer disposed between every two adjacent sub-pixels, wherein an orthographic projection of the mirror layer on the substrate coincides with an orthographic projection of the pixel define layer on the substrate.

* * * * *